United States Patent
Yoshida et al.

(10) Patent No.: US 8,304,986 B2
(45) Date of Patent: Nov. 6, 2012

(54) ORGANIC EL DISPLAY PANEL HAVING SPECIFIC INCLINATION ANGLE OF WALL SURFACE

(75) Inventors: Hidehiro Yoshida, Osaka (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 13/123,769

(22) PCT Filed: Jun. 24, 2010

(86) PCT No.: PCT/JP2010/004215
§ 371 (c)(1),
(2), (4) Date: Apr. 12, 2011

(87) PCT Pub. No.: WO2011/001644
PCT Pub. Date: Jan. 6, 2011

(65) Prior Publication Data
US 2011/0198990 A1    Aug. 18, 2011

(30) Foreign Application Priority Data
Jun. 29, 2009  (JP) ................................. 2009-154240

(51) Int. Cl.
  *H01L 51/00* (2006.01)
(52) U.S. Cl. ...................................... 313/504; 313/506
(58) Field of Classification Search .................. 313/504, 313/506
See application file for complete search history.

(56) References Cited

U.S. PATENT DOCUMENTS

| 7,459,177 B2 | 12/2008 | Kimura et al. |
| 2007/0052199 A1 | 3/2007 | Schulte et al. |
| 2007/0139588 A1* | 6/2007 | Nonaka et al. ................ 349/106 |

FOREIGN PATENT DOCUMENTS

| CN | 1987595 | 6/2007 |
| JP | 2000-331783 | 11/2000 |

(Continued)

OTHER PUBLICATIONS

International Search Report of PCT Application No. PCT/JP2010/004215, dated Jul. 20, 2010.

*Primary Examiner* — Karabi Guharay
(74) *Attorney, Agent, or Firm* — Panasonic Patent Center

(57) ABSTRACT

Disclosed is an organic EL display panel which includes: a substrate; a plurality of linear luminescent regions formed on the substrate, the luminescent regions running in parallel to one another; and two or more sub-pixels arranged in a row in each of the luminescent regions; wherein the luminescent regions include a luminescent region having the sub-pixels emitting red light, a luminescent region having the sub-pixels emitting green light, and a luminescent region having the sub-pixels emitting blue light, each of the sub-pixels includes a pixel electrode disposed on the substrate, an organic functional layer disposed on the pixel electrode by coating, a counter electrode disposed on the organic functional layer, and a forward tapered bank which constitutes wall surfaces of a region in which the organic functional layer is formed, and when an inclination angle of the wall surface of the region on the substrate edge side is defined as inclination angle $\alpha$, and an inclination angle of the wall surface of the region on the substrate center side is defined as inclination angle $\beta$, inclination angle $\alpha$ is smaller than inclination angle $\beta$ in sub-pixel X in luminescent region X provided at the edge of the substrate.

6 Claims, 12 Drawing Sheets

| | FOREIGN PATENT DOCUMENTS | |
|---|---|---|
| JP | 2003-272855 | 9/2003 |
| JP | 2006-003870 | 1/2006 |
| JP | 2006-260779 | 9/2006 |
| JP | 2007-103349 | 4/2007 |
| JP | 2007-165167 | 6/2007 |
| JP | 2007-171237 | 7/2007 |
| JP | 2007-310156 | 11/2007 |
| JP | 2008-016205 | 1/2008 |
| JP | 2009-054608 | 3/2009 |

* cited by examiner

ORGANIC EL DISPLAY PANEL HAVING SPECIFIC INCLINATION ANGLE OF WALL SURFACE

TECHNICAL FIELD

The present invention relates organic EL display panels.

BACKGROUND ART

Organic EL display panels include luminescent elements that utilize the electroluminescent properties of certain organic compounds (organic EL elements).

An organic EL display panel is manufactured by arranging onto a substrate a matrix of sub-pixels (organic EL elements) of three different colors: red (R), green (G), and blue (B). Each set of R, G, and B organic EL elements constitutes one pixel. The respective organic EL elements are manufactured by arranging, in order, pixel electrodes (e.g., anodes), organic EL layers, and counter electrodes (e.g., cathodes) onto a substrate. In some cases, functional layers such as electron injection layers, electron transport layers, hole transport layers, and/or hole injection layers are also formed.

The organic EL elements are typically of three types: organic EL element R which emits red light; organic EL element G which emits green light; and organic EL element B which emits blue light. In some cases, all of the organic EL layers may have white light-emitting luminescent layers while providing color filters that change white light to desired colored light. In other cases, a red light-, green light-, or blue light-emitting organic EL layer are provided for each of the organic EL elements.

Functional layers including organic EL layers, hole injection layers, and hole transport layers are formed for instance by applying coating solutions of functional layer materials onto a substrate and drying the coating solutions. More specifically, banks made of resin or the like are formed over the surface of the substrate to define regions for each of R, G and B, where such functional layers are to be provided. Subsequently, coating solutions are applied in the corresponding regions defined by the banks and dried to form functional layers.

When forming functional layers by coating method in this way, it is possible that the drying rate of coating solution differs between the center and surrounding edge coating region of the panel. The drying rate of a coating solution influences the shape of a functional layer formed. That is, variations in drying rates result in variations in shape profiles and thicknesses of functional layers to be formed. The variations in functional layer thickness among pixels lead to brightness variations across the display.

In an effort to overcome this problem, technologies have been proposed in which the coating region (a region where functional layers are to be formed) at the edge of the panel (edge coating region) is made larger than the coating region at the center of the panel (center coating region) (see Patent Literature 1 listed below). In Patent Literature 1, the edge coating region is made larger than the center coating region, allowing the larger coating region to hold more coating solution than the smaller one. In this manner, the difference in drying rate of coating solution between the center and edge coating regions of the panel is corrected.

Other proposed technologies involve setting the amount of solvent contained in the coating solution applied in the edge coating region of the panel to be larger than the amount of solvent contained in the coating solution applied on the center coating region, so that the difference in drying rate of the coating solution between the center and edge coating regions is corrected (see, e.g., Patent Literature 2).

Yet other proposed technologies involve providing a pixel electrode-free region (dummy region) that surrounds a luminescent region consisting of a matrix of pixels, so that brightness variation across the display that occurs due to the difference in drying rate between the center region and surrounding edge region of the panel can be avoided (see, e.g., Patent Literatures 3 to 6).

Providing such a dummy region around the perimeter of the luminescent region and applying a coating solution in the dummy region in this way results in the formation of functional layers of varying thickness in the dummy region. However, the dummy region can reduce variations in drying rates of coating solutions across the luminescent region positioned at the center of the panel, so that the functional layers to be formed in the luminescent region are uniform in thickness among pixels. In this manner, it is possible to reduce brightness variations across the display.

It should be also noted that functional layers to be formed exhibit different shape profiles depending on the characteristics of the solute and solvent of their coating solution as well as on the ratios of the solute and solvent in the coating solution. For example, when color filters that correspond to the respective colors of organic EL elements are to be formed by coating, coating solutions of the color filters require different solutes depending on the color of the color filter. Thus, when the wall (bank) height and/or bank taper angle are uniform across the substrate, the shape of the color filter tends to vary from color to color. A technology that aims to overcome this problem changes the bank height and/or bank taper angle depending on the color of the color filter, so that the color filters exhibit increased uniformity in thickness (see, e.g., Patent Literature 7).

Moreover, a technology for enhancing light extraction efficiency from organic EL elements employs a transparent electrode for either of the pixel electrode and counter electrode; and employs a reflective electrode for the other while disposing a transparent conductive film by sputtering or the like between the organic EL layer and reflective electrode (see, e.g., Patent Literature 8). By appropriately adjusting the optical distance between the organic EL layer and reflective electrode by means of the transparent conductive film disposed between them, the light beam reflected by the reflective electrode and then travels toward the transparent electrode and the light beam that directly travels toward the transparent electrode are combined together to increase light extraction efficiency.

CITATION LIST

Patent Literature

[PTL 1]
Japanese Patent Application Laid-Open No.2008-16205
[PTL 2]
Japanese Patent Application Laid-Open No.2006-260779
[PTL 3]
Japanese Patent Application Laid-Open No.2007-103349
[PTL 4]
Japanese Patent Application Laid-Open No.2006-3870
[PTL 5]
U.S. Patent Application Publication No.2007/0052199
[PTL 6]
U.S. Pat. No. 7,459,177

[PTL 7]
Japanese Patent Application Laid-Open No.2007-310156
[PTL 8]
Japanese Patent Application Laid-Open No.2003-272855

SUMMARY OF INVENTION

Technical Problem

While the technologies as disclosed by Patent Literature 1 or 2 can correct the difference in drying rate between the center and edge regions of the organic EL panel, these technologies cannot solve the problem of variations in functional layer shape among pixels. The variations in functional layer shape cause brightness variations across the organic EL display panel.

With references to FIGS. 1A to 1D, the mechanism by which the shapes of functional layers become non-uniform among pixels will be described.

FIG. 1A is a cross-sectional view illustrating an organic EL display panel without functional layers. The organic EL display panel illustrated in FIG. 1A includes sub-pixels (organic EL elements) 130R, 130G and 130B arranged on substrate 110. The adjacent sub-pixels are separated by banks 170 formed on substrate 110. Sub-pixel 130R emits red light, sub-pixel 130G emits green light, and sub-pixel 130B emits blue light. The organic EL display panel includes sub-pixel 130RX positioned at the edge of the panel, and sub-pixel 130RY positioned at the center of the panel.

FIG. 1B illustrates a state where coating solution 140 of functional layer has been applied in regions defined by bank 170. FIG. 1C illustrates a state where coating solution 140 in the regions defined by banks 170 is being dried out. Drying of coating solution 140 is accelerated around the edge of the panel due to low solvent vapor concentrations. Because coating solution 140 thus applied moves to positions having high drying rates by convection, coating solution 140 constituting functional layer 180 of sub-pixel 130RX is pulled toward the edge of the panel.

FIG. 1D illustrates the shapes of functional layers 180 formed. FIG. 2A is an enlarged view illustrating sub-pixel 130RX in FIG. 1D. FIG. 2B is an enlarged view illustrating sub-pixel 130RY in FIG. 1D. As described above, since coating solution 140 in sub-pixel 130RX is pulled toward the edge of the panel during drying of coating solution 140, edge 181 of functional layer 180 formed in sub-pixel 130RX, which edge is positioned on the panel edge side, becomes high compared to edge 182 of functional layer 180 positioned on the center side of the substrate. When functional layers are formed by coating in this way, the functional layers in the sub-pixels arranged around the perimeter of the substrate are thicker on the substrate edge side of the coating region. Therefore, thickness T of functional layer 180 of sub-pixel 130RX becomes smaller than thickness T' of functional layer 180 of sub-pixel 130RY.

It is therefore an object of the present invention to provide organic EL display panels free of brightness variations, by providing means of making the shapes of functional layers uniform across the display panel.

Solution to Problem

The inventors established that variations in shape and thickness of organic functional layer among different pixels can be corrected by adjusting the inclination angles of wall surfaces of coating regions defined by banks. The inventors conducted additional studies and completed the present invention.

Specifically, the present invention relates to organic EL display panels given below.

(1) An organic EL display panel including:
a substrate;
two or more linear luminescent regions formed on the substrate, the luminescent regions running in parallel to one another; and
two or more sub-pixels arranged in a row in each of the luminescent regions;
wherein the luminescent regions include a luminescent region having the sub-pixels emitting red light, a luminescent region having the sub-pixels emitting green light, and a luminescent region having the sub-pixels emitting blue light,
each of the sub-pixels includes a pixel electrode disposed on the substrate, an organic functional layer disposed on the pixel electrode by coating, a counter electrode disposed on the organic functional layer, and a forward tapered bank which constitutes wall surfaces of a region in which the organic functional layer is formed, and
when an inclination angle of the wall surface of the region on the substrate edge side is defined as inclination angle α, and an inclination angle of the wall surface of the region on the substrate center side is defined as inclination angle β, inclination angle α is smaller than inclination angle β in sub-pixel X in luminescent region X provided at the edge of the substrate.

(2) The organic EL display panel according to [1] above, wherein the difference between inclination angle α and inclination angle β in sub-pixel X is larger than the difference between inclination angle α and inclination angle β in sub-pixel Y which emits the same color of light as sub-pixel X and which is arranged in luminescent region Y positioned at the center of the substrate.

(3) The organic EL display panel according to (1) or (2) above, wherein the region in which the organic functional layer is formed in each of the sub-pixels is entirely surrounded by the bank.

(4) The organic EL display panel according to (1) or (2) above, wherein the region in which the organic functional layer is formed is shared by the two or more sub-pixels arranged in a row in each of the luminescent region and constitutes one linear region defined by the bank.

(5) The organic EL display panel according to (4) above wherein in one of the linear luminescent regions the inclination angles of the wall surfaces of the region in which the organic functional layer is formed are larger at the sub-pixel positioned at the middle of the linear luminescent region than at the sub-pixel positioned at an end of the linear luminescent region.

(6) The organic EL display panel according to any one of (1) to (5) above, wherein the organic functional layer contains an organic EL layer and a hole transport layer.

Advantageous Effects of Invention

The present invention can prevent functional layers provided in sub-pixels arranged at the edge of the substrate from being thicker on the substrate edge side and thereby can make their shapes and thicknesses uniform among pixels. Thus, the present invention can provide organic EL display panels with uniform brightness.

DESCRIPTION OF EMBODIMENTS

Figure 1A:
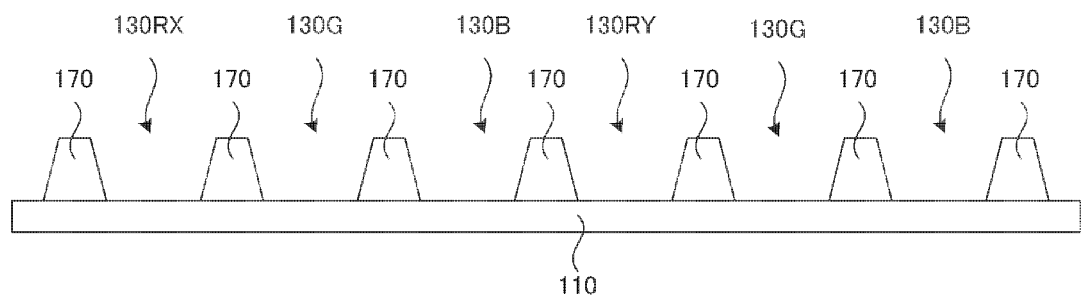
FIGS. 1A to 1D illustrate the behavior of coating solutions of functional layers during formation of functional layers by coating.
Figure 1B:
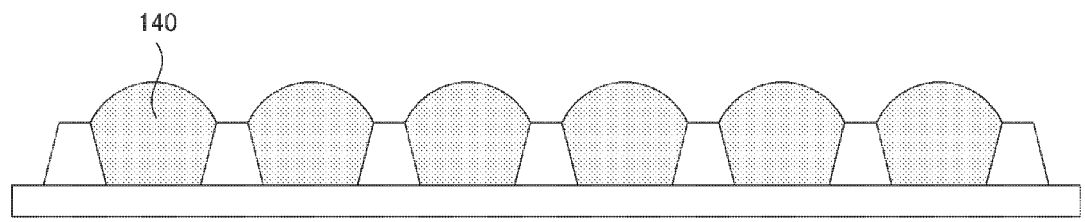
Figure 1C:
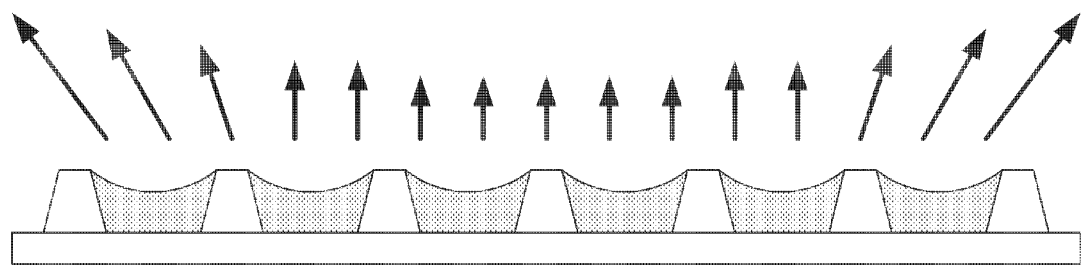
Figure 1D:
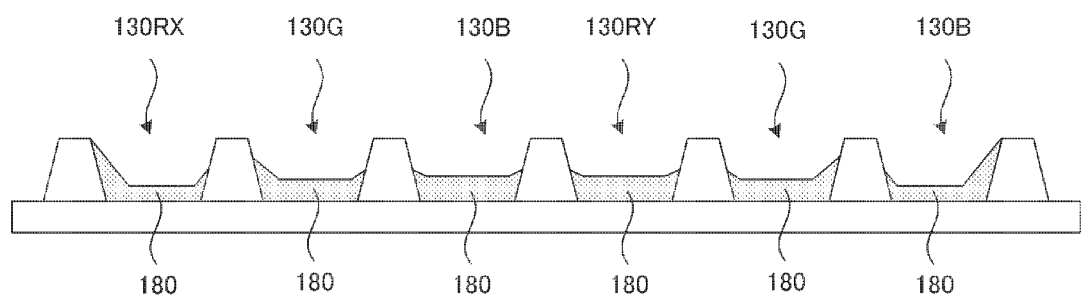

An organic EL display panel of the present invention includes a substrate and multiple sub-pixels (organic EL elements) arranged on the substrate.

[Substrate]

The substrate includes linear luminescent regions that run in parallel to one another. As used herein, "luminescent region" means a region in which a row of sub-pixels of any one of R, G and B is arranged. Specifically, linear luminescent regions of three different colors (R, G, and B) are arranged side by side across the substrate. For example, a green luminescent region is arranged next to a red luminescent region; a blue luminescent region is arranged next to the green luminescent region; another red luminescent region is arranged next to the blue luminescent region; and so forth.

Herein, a group of luminescent regions positioned at the edge of the substrate is referred to as "luminescent region X", and a group of luminescent regions positioned at the center of the substrate and includes sub-pixels that produce the same color as the sub-pixels of luminescent region X is referred to as "luminescent region Y". As used herein, "edge of substrate" encompasses not only the edge of the substrate, but an area of the substrate which is located relatively outside with respect to the center of the substrate. Similarly, as used herein, "center of substrate" encompasses not only the center of the substrate, but an area of the substrate which is located relatively inside with respect to the edge of the substrate. Namely, the terms "edge of substrate" and "center of substrate" are used to specify the relative positional relationship of two areas of substrate being compared.

The choice of the material of the substrate varies depending on whether the organic EL display panel according to the present invention is of a bottom emission type or a top emission type. In the case of the bottom emission type, the material of the substrate is not specifically limited as long as it is transparent and insulating. Examples of such materials include glass and transparent resins. In the case of the top emission type, on the other hand, the material is not specifically limited as long as it is insulating. The size and thickness of the substrate are appropriately determined depending on the size of the organic EL display panel to be manufactured or the type of the substrate material.

The substrate may further include thin film transistors for driving organic EL elements (driving TFTs). The source electrode or drain electrode of a TFT is connected to a pixel electrode as described later.

[Sub-Pixel]

As described above, sub-pixels (organic EL elements) include three types of sub-pixels: sub-pixels which emit red light, sub-pixels which emit green light, and sub-pixels which emit blue light. Each set of R, G and B sub-pixels constitutes one pixel.

Herein, the sub-pixel arranged in luminescent region X positioned at the edge of the substrate is referred to as "sub-pixel X", and the sub-pixel arranged in luminescent region Y positioned at the center of the substrate is referred to as "sub-pixel Y". Sub-pixels X and Y emit the same color of light.

The sub-pixels arranged on the substrate each include 1) a pixel electrode, 2) a bank, 3) an organic functional layer, and 4) a counter electrode, each of which will be described below.

1) Pixel Electrode

The pixel electrode is a conductive member arranged on the substrate, which typically functions as an anode but may function as a cathode in some cases. The pixel electrode may include a film made of transition metal oxide (e.g., tungsten oxide or molybdenum oxide) formed on the surface. The transition metal oxide film formed on the surface of the pixel electrode functions as a hole injection layer.

The choice of the material of the pixel electrode varies depending on whether the organic EL display panel according to the present invention is of the bottom emission type or the top emission type. In the case of the bottom emission type, the material of the pixel electrode is not specifically limited as long as it is transparent and conductive. Examples of such materials include indium tin oxide (ITO), indium zinc oxide (IZO), and zinc oxide (ZnO). In the case of the top emission type, on the other hand, the material of the pixel electrode is not specifically limited as long as it is light reflective and electrically conductive. Examples of such materials include silver-containing alloys, more specifically Ag—Pd—Cu (APC) alloys and Ag—Ru—Au (ARA) alloys; MoCr (molybdenum-chrome) alloys; NiCr (nickel-chrome) alloys; and Al—Nd (aluminum-neodymium) alloys. The light-reflective pixel electrode may include an ITO or IZO film formed on the surface.

2) Bank

The bank constitutes wall surfaces of a region to be coated with an organic functional layer (hereinafter also referred to as "coating region"). Thus, the bank defines coating regions. In the present invention, the bank may define a matrix of coating regions or lines of coating regions.

Figure 3A:
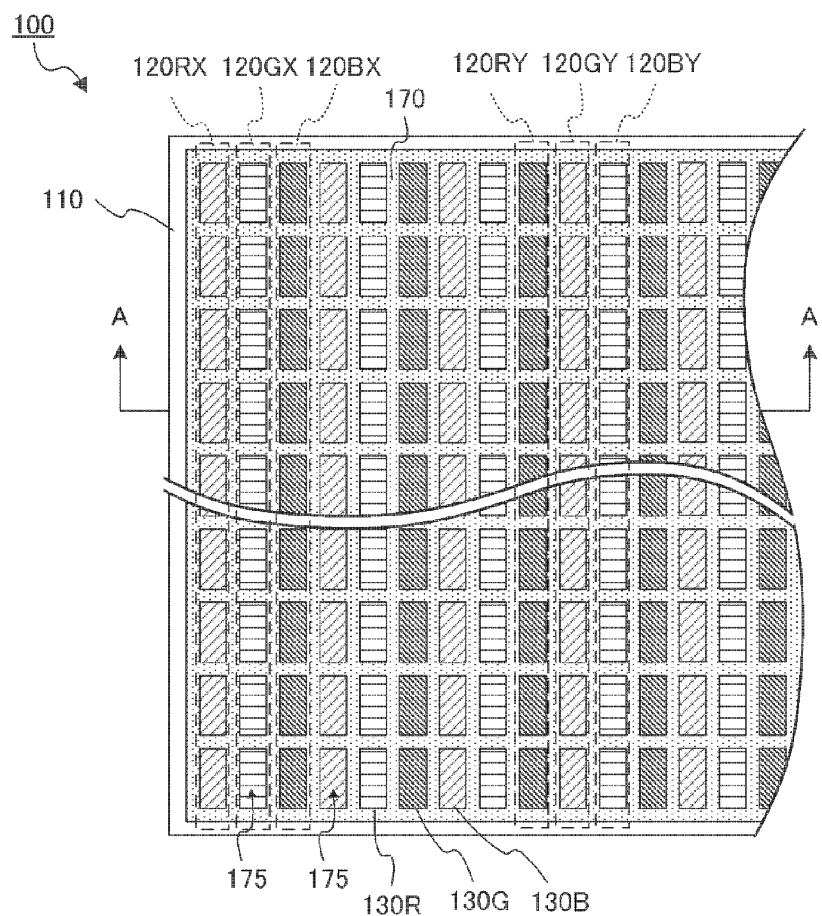
FIGS. 3A and 3B illustrate an organic EL display panel according to embodiment 1.

In the case where the bank defines a matrix of coating regions, the organic EL display panel includes a lattice-shaped bank (see FIG. 3A). Accordingly, the discrete coating regions of the respective sub-pixels are entirely surrounded by the bank. On the other hand, when the coating regions are defined linearly, the organic EL display panel includes multiple linear banks arranged side by side. One coating region in which a row of multiple sub-pixels is arranged to constitute a luminescent region is defined by one set of adjacent linear banks (see FIG. 9A).

The bank height as measured from the substrate surface is preferably 0.1-3 μm, most preferably 0.8-1.2 μm. A bank height of greater than 3 μm may result in reduced step coverage of a counter electrode shared by all of the organic EL elements described later. On the other hand, a bank height of less than 0.1 μm may result in leakage of ink from the coating region via bank top surface.

The bank preferably has a forward tapered shaped. As used herein, "forward tapered shape" means a bank shape in which the bank's side surfaces are inclined in such a way that the bank's bottom surface area is larger than the top surface area. The bank's taper angle is preferably 80° C. or less. When the taper angle is greater than 80° C., it reduces step coverage of the counter electrode.

Examples of materials of the bank include insulating resins such as polyimides. The bank surface preferably has low wettability, e.g., lyophobic property. To achieve low wettability on the bank surface, for example, fluorine resin containing fluorine compound may be employed, or the bank surface can be fluorinated by treatment with fluorine gas plasma.

Examples of fluorine compounds contained fluorine resins include fluorinated resins such as vinylidene fluoride, vinyl fluoride, ethylene trifluoride, and copolymers thereof. Examples of resins contained in fluorine resins include phenol-novolac resins, polyvinylphenol resins, acrylate resins, methacrylate resins, and combinations thereof.

Additional specific examples of fluorine resins include LUMIFLON® (Asahi Glass, Co., Ltd.), a copolymer of fluorine polymer (fluoroethylene) disclosed for example in JP-A No.2002-543469 and vinyl ether.

The bank is formed, for example, by photolithography. The process of forming a bank by photolithography includes, for example, the steps i) forming a photosensitive resin film on a substrate; ii) exposing the photosensitive resin film; iii) patterning the photosensitive resin film by development; and iv) baking the patterned resin film so as to be secured to the substrate (see FIGS. 5A to 5D).

A feature of the present invention lies in the inclination angles of the wall surfaces of the coating region of sub-pixel X provided in luminescent region X positioned at the edge of the substrate. Herein, "wall surfaces of a coating region" refer to opposing wall surfaces of a coating region that run in parallel to the running direction of the luminescent region. Among the two opposing wall surfaces the wall surface on the substrate's edge side is also referred to as "wall surface W1", and the other wall surface on the substrate's center side is also referred to as "wall surface W2". Further, the inclination angle of wall surface W1 is also referred to as "inclination angle $\alpha$", and the inclination angle of wall surface W2 is also referred to as "inclination angle $\beta$".

Moreover, "coating region(s) of sub-pixel(s)" means, when each sub-pixel includes a coating region which is entirely surrounded by a bank, discrete coating regions entirely surrounded by a bank (see FIG. 3A). On the other hand, when a coating region is linear, the term means regions obtained by equally dividing the coating region by the number of the sub-pixels in the luminescent region (see FIG. 9A).

More specifically, the feature of the present invention is that in each sub-pixel X inclination angle $\alpha$ of wall surface W1 is smaller than inclination angle $\beta$ of wall surface W2. In sub-pixels X, inclination angle $\alpha$ is 20-60°, and inclination angle $\beta$ of wall surface W2 is 40-70°. Further, in sub-pixels X the maximum difference between inclination angle $\alpha$ and inclination angle $\beta$ is 10-50°.

In the present invention, the inclination angles of the wall surfaces of sub-pixels are adjusted depending on the positons of luminescent regions. Specifically, inclination angle $\alpha$ and inclination angle $\beta$ are 40-70° in sub-pixels Y provided in luminescent region Y positioned at the center of the substrate. That is, in sub-pixel Y there is small or no difference between inclination angle $\alpha$ and inclination angle $\beta$, whereas in sub-pixel X the difference between inclination angle $\alpha$ and inclination angle $\beta$ is large.

To appropriately adjust the inclination angles of the wall surfaces of coating regions in this way, it is only necessary to adjust the taper angle of bank walls which constitute the wall surfaces of a coating region. Adjustment of the taper angle of bank walls can be achieved by adjusting the exposure dose upon exposure of a photosensitive resin film. For this, for example, photocurable resin is employed for the photosensitive resin film, and portions for which smaller taper angles are desired are exposed with a weak light beam via a multi tone mask such as a gray tone mask or half tone mask (see FIG. 5B).

In this way, appropriate adjustment of the inclination angles of the wall surfaces of coating regions of sub-pixels can correct variations in shape and thickness of organic functional layer among pixels, which variations are caused by non-uniform drying rates of coating solutions. The mechanism by which such variations are corrected will be described in detail in Embodiment 1 with reference to the drawings.

3) Organic Functional Layer

An organic functional layer is disposed on a pixel electrode and contains at least an organic EL layer. In the present invention, coating solutions of organic functional layer are applied in coating regions defined by banks to form organic functional layers therein. For example, coating solutions—solutions prepared by dissolving materials of organic functional layers into organic solvent such as anisole or cyclohexylbenzene—are applied by coating (e.g., inkjet printing), followed drying. The thickness of the organic functional layer is not specifically limited; for example, the thickness may be around 50-200 nm.

The choice of organic EL material of the organic EL layer in the organic functional layer is appropriately determined depending on the color (R, G, or B) of light to be produced from the sub-pixel (organic EL element). Organic EL materials to be contained in the organic EL layers may be either of polymeric or low molecular weight organic EL materials. It is, however, preferable to employ polymeric organic EL materials in view of the fact that the organic EL layers are prepared by coating. Using polymeric organic EL materials, organic EL layers can be readily formed without damaging other members. Examples of polymeric organic EL materials include polyphenylenevinylene and its derivatives, polyacetylene and its derivatives, polyphenylene and its derivatives, poly para phenylene ethylene and its derivatives, poly (3-hexylthiophene) (P3HT) and its derivatives, and polyfluorene (PF) and its derivatives. Examples of low-molecular weight organic EL materials include tris(8-quinolinolate) aluminum.

The organic functional layer may include a hole injection layer, a hole transport layer (interlayer), an electron injection layer and/or an electron transport layer, in addition to the organic EL layer.

The hole injection layer contains, for example, poly(3,4-ethylenedioxythiophene) doped with polyethylene sulfonate (called "PEDOT-PSS") or derivative thereof (e.g., copolymer). Such a hole injection layer is formed by applying a coating solution of hole injection layer (ink containing PEDOT-PSS in water) onto a pixel electrode.

The hole transport layer is disposed between the pixel electrode (or hole injection layer) and organic EL layer. The hole transport layer efficiently transport holes to the organic EL layer and blocks entry of electrons into the pixel electrode. The material of the hole transport layer is preferably a copolymer of polyfluorene and a triphenylamine derivative.

The hole transport layer can be formed by applying a coating solution (e.g., a solution prepared by dissolving hole transport layer material into organic solvent such as anisole or cyclobenzen) onto the pixel electrode (or hole injection layer). The thickness of the hole transport layer is not specifically limited and may be around 10-40 nm, for example.

When the organic functional layer includes such additional layers as a hole injection layer and a hole transport layer, a light reflective electrode can be employed for the pixel electrode, so that the optical distance between the organic EL layer and pixel electrode can be adjusted by adjusting the thicknesses of the hole injection layer and hole transport layer to be coated. In particular, the hole transport layer is suitable as a layer for adjusting the above optical distance because even when its thickness somewhat changed it hardly influences electroluminescence characteristics of the organic EL element. By adjusting the optical distance by means of the hole injection layer and/or hole transport layer in this way, it is possible to enhance light extraction efficiecy from the organic EL element. In this case, an optimal optical distance differs depending on the wavelength of light. Thus, in cases where a hole injection layer and/or hole transport layer is formed to adjust the optical distance, the thickness of the hole injection layer or hole transport layer should differ from one color to another among RGB, so too does the thickness of the organic functional layer.

Meanwhile, the organic functional layers of sub-pixels which emit the same color of light are preferably uniform in thickness. This is because variations in organic functional layer thickness among sub-pixels which emit the same color of light results in brightness variations across the organic EL display panel. In particular, when the optical distance is adjusted by means of organic functional layer, variations in organic functional layer thickness among sub-pixels which emit the same color of light result in two types of sub-pixels: one having an appropriately adjusted optical distance, and the other having a poorly adjusted optical distance. Non-uniform optical distances lead to remarkable brightness variations. As used herein, "thickness of organic functional layer" means a thickness of an organic functional layer as measured at the thinnest portion (see FIGS. 4A and 4B).

4) Counter Electrode

The counter electrode is an electrically conductive member disposed over organic functional layer(s). The counter electrode generally serves as a cathode, but may also serve as an anode. Multiple sub-pixels may share one counter electrode. For example, in the case of an active-matrix organic EL display panel, all of the sub-pixels of the entire display panel may share one counter electrode.

The material of the counter electrode varies depending on whether the organic EL display panel according to the present invention is of the bottom emission type or the top emission type. In the case of the top emission type, the material of the counter electrode is not specifically limited as long as it is transparent and electrically conductive. Examples thereof include ITO, IZO and ZnO. Meanwhile, in the case of the bottom emission type, the material of counter electrode is specifically limited as long as it is electrically conductive. Examples thereof include barium, barium oxide and aluminum.

A sealing film may also be disposed on the counter electrode. The sealing film protects the organic functional layers and pixel electrodes against moisture, heat, and impact. Examples of materials of the sealing film include silicon nitride and silicon oxynitride.

Embodiments of an organic EL display panel according to the present invention will be described below with reference to the drawings. It should be noted that the embodiments shall not be construed as limiting the invention thereto.

(Embodiment 1)

Figure 3B:
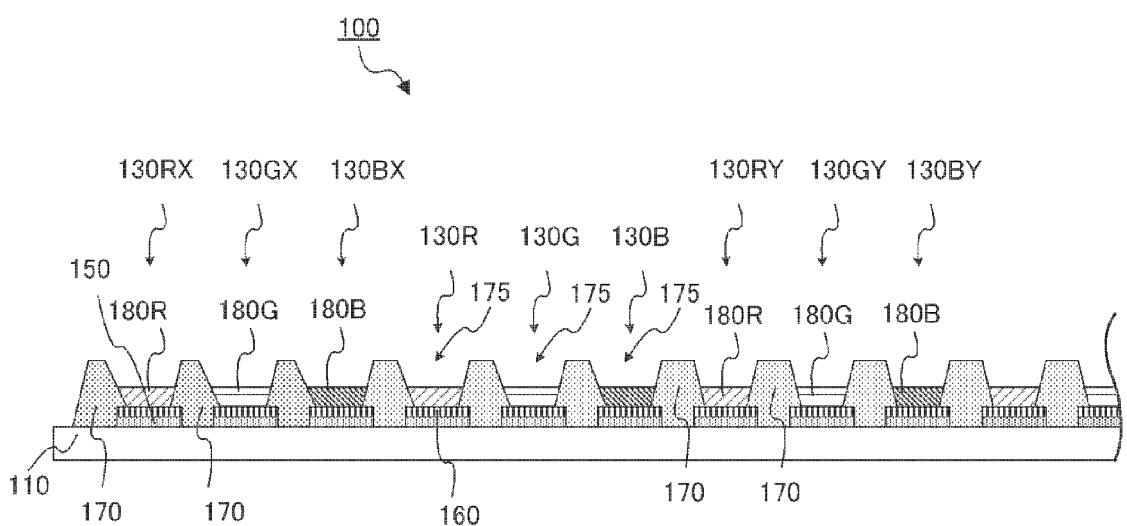

FIG. 3A is a plan view illustrating organic EL display panel according to Embodiment 1. FIG. 3B is a cross-sectional view of organic EL display panel 100 of Embodiment 1 cut along A-A line.

As illustrated in FIGS. 3A and 3B, organic EL display panel 100 includes substrate 110 which includes thereon luminescent regions 120 that run in parallel to one another, and sub-pixels (organic EL elements) 130 arranged in respective luminescent regions 120 in a row.

Luminescent regions 120 include luminescent regions 120R in which sub-pixels 130R which emit red light are arranged; luminescent regions 120G in which sub-pixels 130G which emit green light are arranged; and luminescent regions 120B in which sub-pixels 130B which emit blue light are arranged. One set of sub-pixel 130R, sub-pixel 130G and sub-pixel 130B constitutes one pixel.

Luminescent regions 120 also include luminescent region 120X (luminescent regions 120RX, 120GX and 120BX) positioned at the edge of substrate 110; and luminescent region 120Y (luminescent regions 120RY, 120GY and 120BY) positioned at the center of substrate 110. Luminescent region 120X includes sub-pixels 130X (sub-pixels 130RX, 130GX and 130BX) arranged therein, and luminescent region 120Y include sub-pixels 130Y (130RY, 130GY and 130BY) arranged therein (see FIG. 3B).

As illustrated in FIG. 3B, each sub-pixel 130 includes pixel electrode 150 disposed on substrate 110, metal oxide film 160 disposed on the pixel electrode, bank 170 which defines coating region 175, organic functional layer 180 formed in coating region 175, and counter electrode 190 (not shown) disposed on organic functional layer 180. Organic functional layer 180 is disposed on metal oxide film 160.

The wall surfaces of coating region 175 are formed of the side surfaces of bank 170. In this embodiment, bank 170 is formed in a lattice pattern; each sub-pixel 130 includes coating region 175 entirely surrounded by bank 170.

Metal oxide film 160 is made of, for example, tungsten oxide and functions as a hole injection layer.

Organic functional layer 180R contained in sub-pixel 130R include an organic EL layer which emits red light; organic functional layer 180G contained in sub-pixel 130G include an organic EL layer which emits green light; and organic functional layer 180B contained in sub-pixel 130B include an organic EL layer which emits blue light.

Figure 4A:
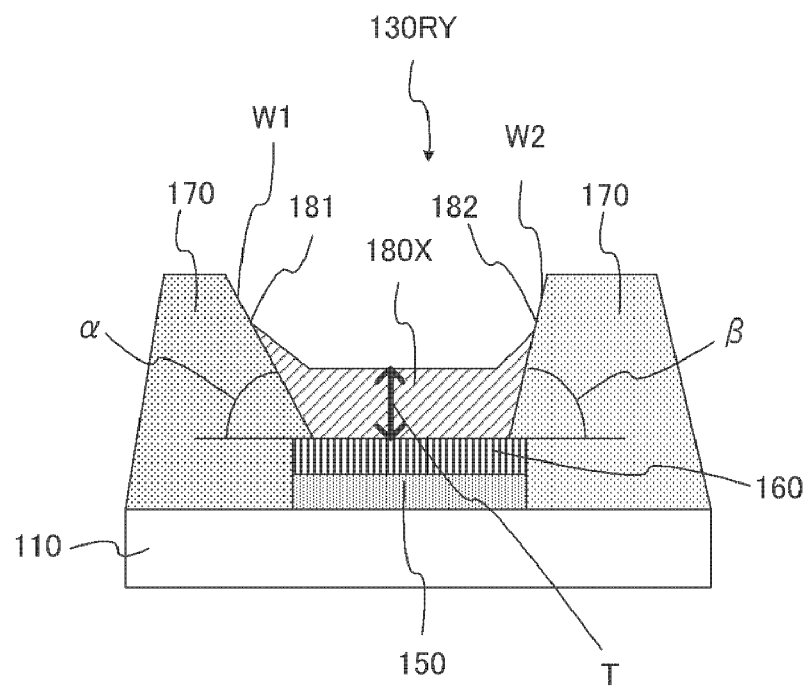
FIGS. 4A and 4B are cross-sectional views illustrating a sub-pixel contained in the organic EL display panel according to Embodiment 1.
Figure 4B:
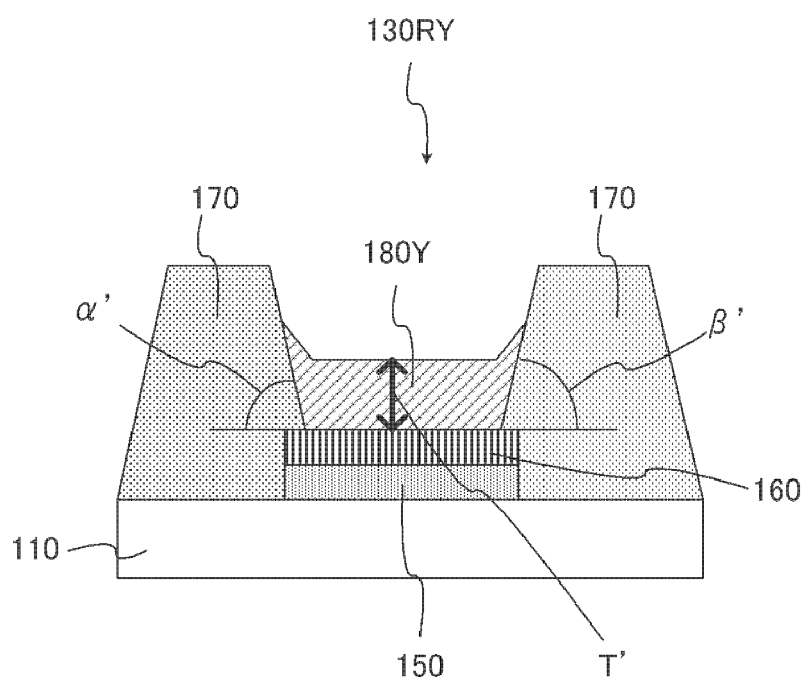

FIG. 4A is an enlarged view of sub-pixel 130RX illustrated in FIG. 3B, and FIG. 4B is an enlarged view of sub-pixel 130RY illustrated in FIG. 3B.

As illustrated in FIG. 4A, in sub-pixel RX, inclination angle α of wall surface W1 is smaller than inclination angle β of wall surface W2. In sub-pixel 130RY, on the other hand, inclination angle α of wall surface W1 and inclination angle β of wall surface W2 are comparable, as illustrated in FIG. 4B.

Thus, the difference between inclination angle α and inclination angle β in sub-pixel 130RX is larger than the difference between inclination angle α and inclination angle β in sub-pixel 130RY.

Next, a method of forming bank 170 that constitutes the wall surfaces of coating regions 175 by photolithography will be described with reference to the drawings. FIGS. 5A to 5D illustrate a process for forming bank 170 of sub-pixel 130RX positioned at the edge of substrate 110.

Figure 5A:
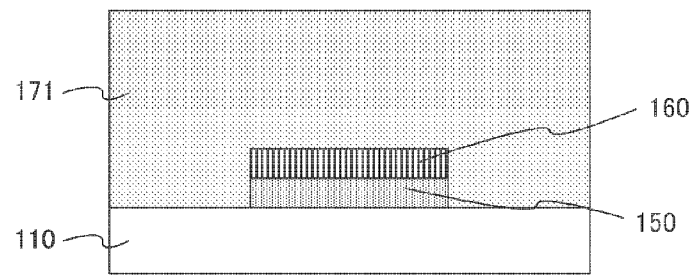
FIGS. 5A to 5D illustrate a process of forming a bank.
Figure 5B:
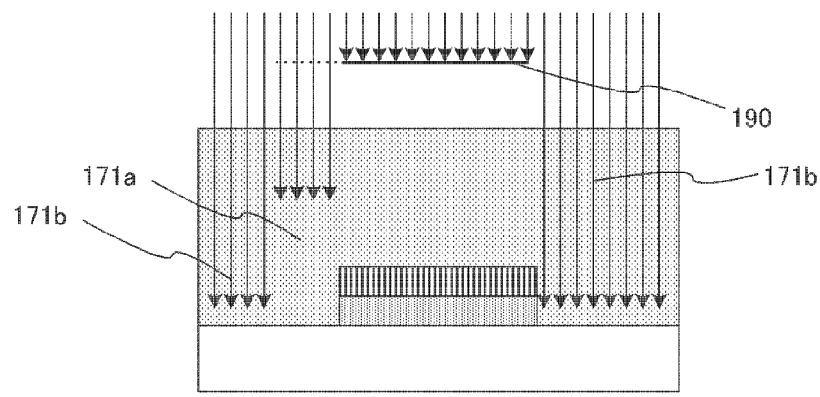
Figure 5C:
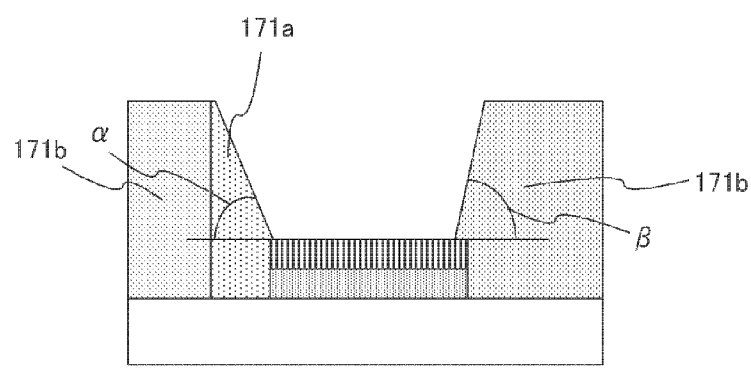
Figure 5D:
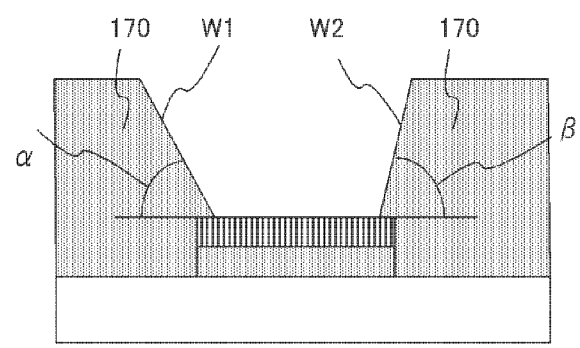

As illustrated in FIGS. 5A to 5D, the method of forming bank 170 includes: 1) a first step of forming photosensitive resin film 171 on substrate 110 (FIG. 5A); 2) a second step of exposing selected portions of photosensitive resin film 171 (FIG. 5B); 3) a third step of patterning photosensitive resin film 171 by developing (FIG. 5C); and 4) a fourth step of baking the patterned resin film 171 to secure it to substrate 110 (FIG. 5D).

FIG. 5A illustrates the first step. As illustrated in FIG. 5A, in the first step, photosensitive resin film 171 is formed on substrate 110 which includes pixel electrodes 150 covered with metal oxide film 160. Although a photosensitive resin film made of photocurable resin (i.e., negative photoresist) is used in this embodiment, a positive photoresist may also be used.

Formation of photosensitive resin film 171 on substrate 110 can be achieved by applying a photosensitive resin composition onto substrate 110 by spin coating, die coating or slit coating and pre-baking the applied resin composition. Pre-baking condition is not specifically limited; the coated substrate is allowed to stand at 80-100° C. (e.g., 100° C.) for 2-3 minutes.

FIG. 5B illustrates the second step. As illustrated in FIG. 5B, photosensitive resin film 171 is exposed. More specifically, portions of photosensitive resin film 171 corresponding to bank 170 are selectively exposed. In this embodiment, regions 171a of photosensitive resin film 171 that correspond to wall surfaces W1 of bank 170 are exposed to weak light using half tone mask 190, whereas regions 171b that correspond to the remaining portions of bank 170 are exposed to strong light without using any mask.

The photosensitive resin cures by exposure to light, so that the cured portions exhibit increased elasticity and glass transition temperature. The curing degree depends on the dose of irradiation. Thus, regions 171a exposed to weaker light show relatively lower curing degrees, whereas regions 171b exposed to stronger light show relatively higher curing degrees.

FIG. 5C illustrates the third step. As illustrated in FIG. 5C, exposed photosensitive resin film 171 exposed is developed in the third step. Development of photosensitive resin film 171 can be achieved by immersing substrate 110 having exposed photosensitive resin film 171 attached into, for example, 0.2% tetramethylammonium hydroxide (TMAH) solution for 60 seconds, followed by rinsing with pure water for 60 seconds.

Regions 171a exposed to weaker light show lower curing degrees as described above. Thus, during development, at regions 171a the edges of resin film 171 melt to a greater extent than at regions 171b, which have higher curing degrees and therefore are less prone to melting. Accordingly, inclination angle α of side surface of region 171a becomes relatively small, whereas inclination angle β of side surface of region 171b becomes relatively large.

FIG. 5D illustrates the fourth step. As illustrated in FIG. 5D, in the fourth step, patterned resin film 171 is baked (post baking) so as to be secured to substrate 110. Post baking condition is not specifically limited; for example, baking temperature is set to about 200° C. or higher (e.g., 220° C.), and baking time is set to about 1 hour. Post-baking of patterned resin film 171 removes remaining solvent and moisture therein and thus increases its adhesion to substrate 110, whereby resin film 171 is secured to substrate 110. Resin film 171 secured to substrate 110 constitutes bank 170.

By locally adjusting the exposure condition in this way upon formation of bank 170 by photolithography, the taper angle of walls of bank 170, and accordingly the inclination angles of wall surfaces of coating region 175, can be adjusted.

By making inclination angle α smaller than inclination angle β in sub-pixel 130X, it is possible to correct unevenness of organic functional layer 180X in sub-pixel 130X. It is thus possible to allow the organic functional layer of sub-pixel 130X positioned at the edge of substrate 110 to be uniform in thickness, thus correcting variations in organic functional layer 180 thickness among different pixels.

Next, the mechanism by which the thickness of an organic functional layer becomes uniform by adjusting the inclination angles of the wall surfaces of a coating region will be described, while explaining the drying behavior of a coating solution of organic functional layer applied in a coating region defined by a bank. FIGS. 6A to 6C and FIGS. 7A to 7E are schematic diagrams illustrating a fundamental drying behavior of a coating solution.

Figure 6A:
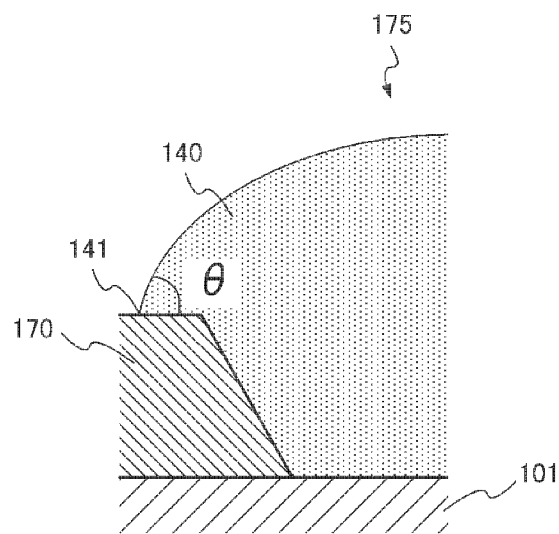
FIGS. 6A to 6C illustrate the behavior of a coating solution of an organic functional layer during the drying process.

FIG. 6A is a schematic diagram illustrating a state of coating solution 140 of organic functional layer immediately after it has been applied in coating region 175 defined by bank 170. As illustrated in FIG. 6A, coating solution 140 overflows coating region 175 and reaches the top surface of bank 170. Immediately after the coating process, coating solution 140 retains a contact angle of θ with respect to the bank top surface by the balance of surface tension forces at liquid droplet edge 141.

Figure 6B:
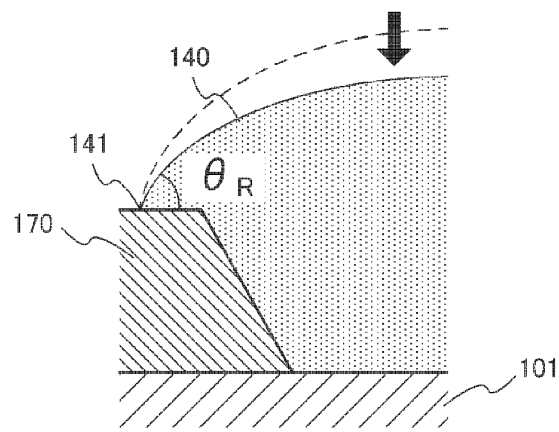

Once the coating solution 140 starts to dry up, evaporation of solvent causes contact angle θ to decrease to receding contact angle $θ_R$, with the position of liquid droplet edge 141 fixed so long as the balance of surface tension forces is maintained, as illustrated in FIG. 6B. This type of drying mode is called "constant contact radius (CCR) mode" as the radius of a liquid droplet is kept constant.

It should be noted that receding contact angle $θ_R$ varies depending on the nature (e.g., viscosity) of the coating solution and physical properties (e.g., surface free energy) of bank surface.

Figure 6C:
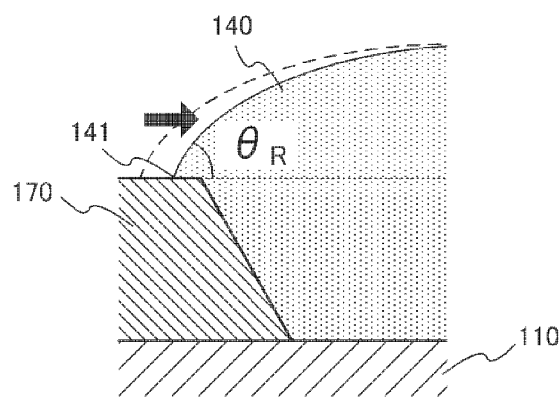

Once the contact angle of coating solution 140 has decreased to receding contact angle $θ_R$, the balance of surface tension forces at liquid droplet edge 141 is disrupted, resulting in the generation of a force that draws coating solution 140 toward the inside of the coating region. As a consequence, as illustrated in FIG. 6C, liquid droplet edge 141 moves toward the inside of the coating region due to evaporation of solvent, with receding contact angle $θ_R$ kept constant, thus reducing the radius of the liquid droplet. This type of drying mode is called "constant contact angle (CCA) mode" as the contact angle with respect to the top surface of bank 170 is kept constant. Reduction of liquid droplet radius continues until liquid droplet edge 141 reaches the corner of bank 170 (i.e., boundary between the top surface and wall surface of the bank).

Figure 7A:
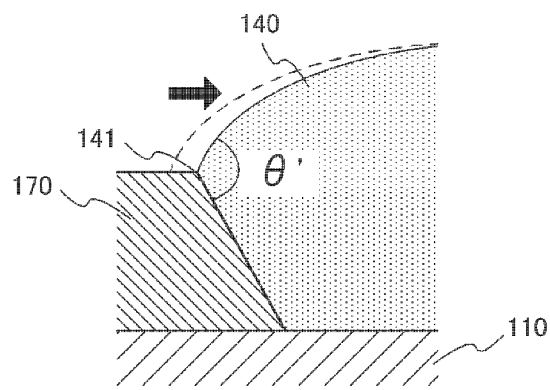
FIGS. 7A to 7E illustrate the behavior of a coating solution of an organic functional layer during the drying process.
Figure 7B:
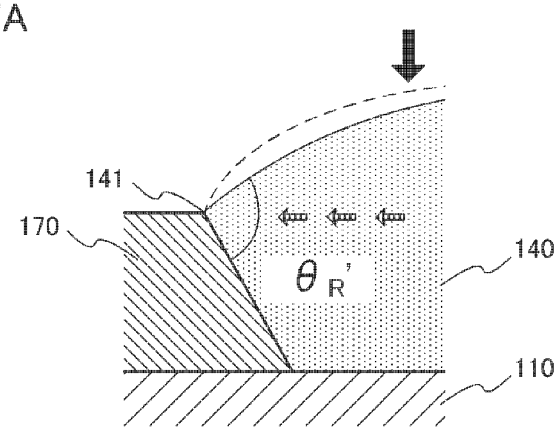

Once liquid droplet edge 141 has reached the corner of bank 170, the reference surface on which measurement of contact angle is based changes from the bank top surface to the bank side surface (wall surface of coating region) as illustrated in FIG. 7A; therefore, contact angle increases to θ'. For this reason, contact angle becomes larger than receding contact angle and thus the surface tension forces at liquid droplet edge 141 are again balanced. As a result, drying of the coating solution assumes CCR mode so that contact angle θ' decreases to receding contact angle $θ_R'$ due to evaporation of solvent, with liquid droplet edge 141 fixed at the corner of bank 170.

Figure 7C:
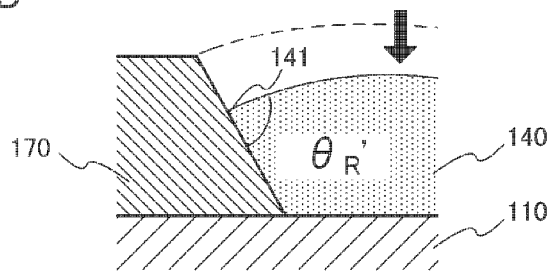

Once the contact angle has decreased to receding contact angle $\theta_R'$, as illustrated in FIG. 7C, drying of the coating solution assumes CCA mode so that the evaporation of solvent causes liquid droplet edge 141 to move along the wall surface with contact angle $\theta_R'$ kept constant. In this way the volume of the liquid droplet decreases.

Figure 7D:
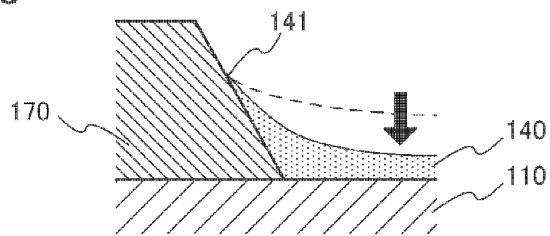
Figure 7E:
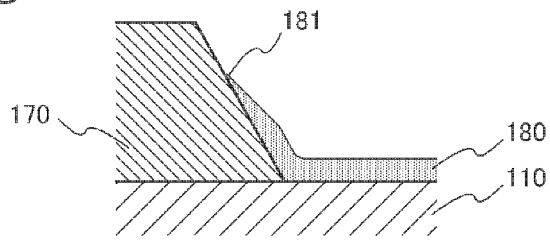

When the concentration of the solute in the vicinity of liquid droplet edge 141 has reached a critical concentration due to drying, as illustrated in FIG. 7D, coating solution 140 is gelled, and liquid droplet edge 141 is fixed to the wall surface of the coating region. The positioning of a liquid droplet edge in this manner is called "pinning". In particular, pinning that occurs due to increases in the concentration (viscosity) of a coating solution is called "self pinning". After self pinning has occurred, drying continues in a state where liquid droplet edge 141 is fixed to the wall surface as illustrated in FIG. 7E, resulting in the formation of organic functional layer 180.

In this way, in coating regions, drying of solution proceeds while alternately repeating CCR mode and CCA mode.

Here, when the inclination angle of the wall surface of the coating region is made small, the contact angle of coating solution 140 with respect to the wall surface becomes small. For this reason, once the solvent has evaporated, the contact angle immediately reaches receding contact angle $\theta_R'$, thus prolonging the CCA mode drying period where liquid droplet edge 141 moves down to reduce the liquid volume. Prolonged drying period in CCA mode causes liquid droplet edge 141 to move down to lower positions of the wall surface of the coating region before the solute concentration in the vicinity of liquid droplet edge 141 reaches a critical concentration. Accordingly, the position at which liquid droplet edge 141 is fixed to the wall surface of the coating region becomes low (i.e., the height of the edge of the organic functional layer decreases).

As described above, in sub-pixel 130X arranged at the edge of substrate 110, a non-uniform drying rate of the coating solution makes edge 181 of organic functional layer 180X higher than edge 182. Thus, organic functional layer 180X is thicker near the edge of substrate 110 (see FIG. 2A).

However, when inclination angle α is made smaller than inclination angle β in sub-pixel 130X as in this embodiment, the height of the edge of organic functional layer 180X on wall surface W1 of the coating region can be reduced, whereby the unevenness of organic functional layer 180X can be corrected (see FIG. 4A).

Meanwhile, in the case of sub-pixel 130Y positioned at the center of the substrate, unevenness does not occur in organic functional layer 180. Thus, even when inclination angle α and inclination angle β have the same value, it is possible to obtain organic functional layer 180 with uniform thickness (see FIG. 4B). Accordingly, thickness T of organic functional layer 180X in sub-pixel 130RX equals to thickness T' of organic functional layer 180Y in sub-pixel 130RY (see FIGS. 4A and 4B).

Thus, in this embodiment, it is possible to correct unevenness of an organic functional layer in a sub-pixel positioned at the edge of the substrate by adjusting the inclination angles of the wall surfaces of the coating region of the sub-pixel, and thus to make uniform the thickness of the organic functional layer in the sub-pixel, correcting variations in organic functional layer thickness among pixels. It is thus made possible to provide organic EL display panels having uniform thickness among pixels.

Furthermore, it is preferable in this embodiment that the difference between inclination angle α and inclination angle β in a sub-pixel (hereinafter also referred to "angle difference") gradually decreases with approaching the drying center point. As used herein, "drying center point" means a virtual point at which the drying rate of a coating solution applied becomes the smallest during manufacture of an organic EL display panel. The drying center point may appear inside or outside the panel.

Figure 8A:
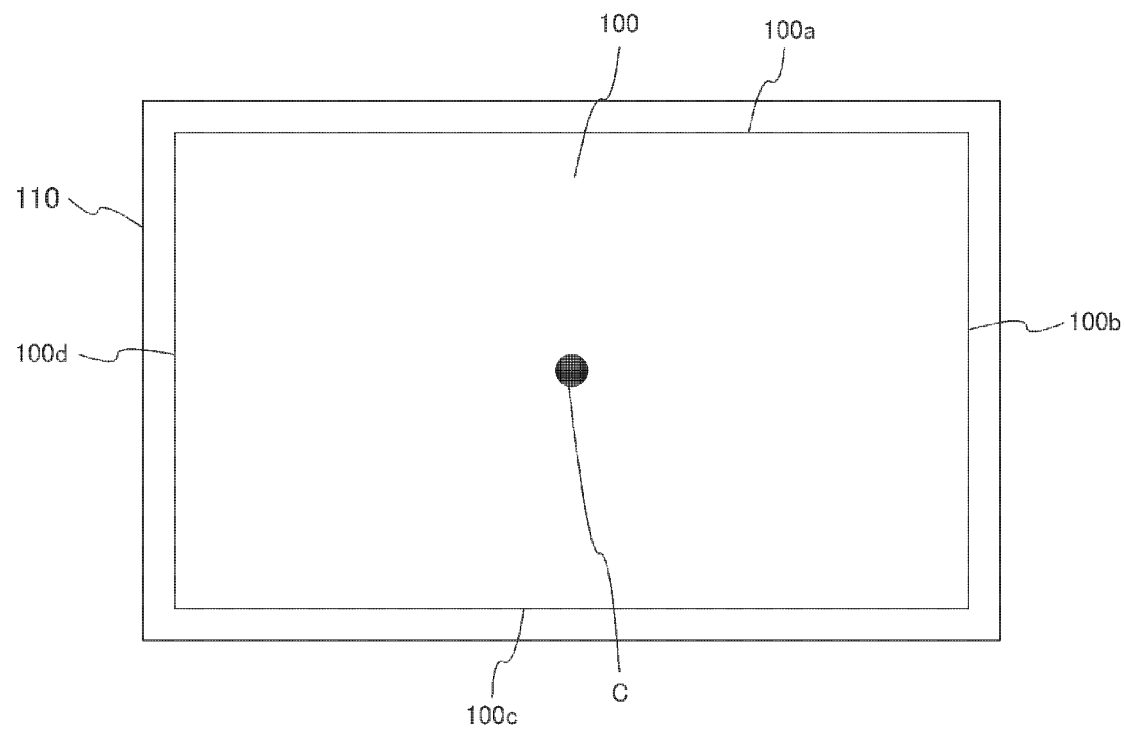
FIGS. 8A and 8B are diagrams for explaining a drying center point.

For example, when one organic EL display panel 100 is to be manufactured from one substrate 110 as illustrated in FIG. 8A, drying center point C appears at the center of organic EL display panel 100. In this case, the angle difference is determined in such a way that it becomes maximum in the sub-pixels arranged at the four edges (100a, 100b, 100c, and 100d) of organic EL display panel 100 and gradually decreases with approaching drying center point C.

Figure 8B:
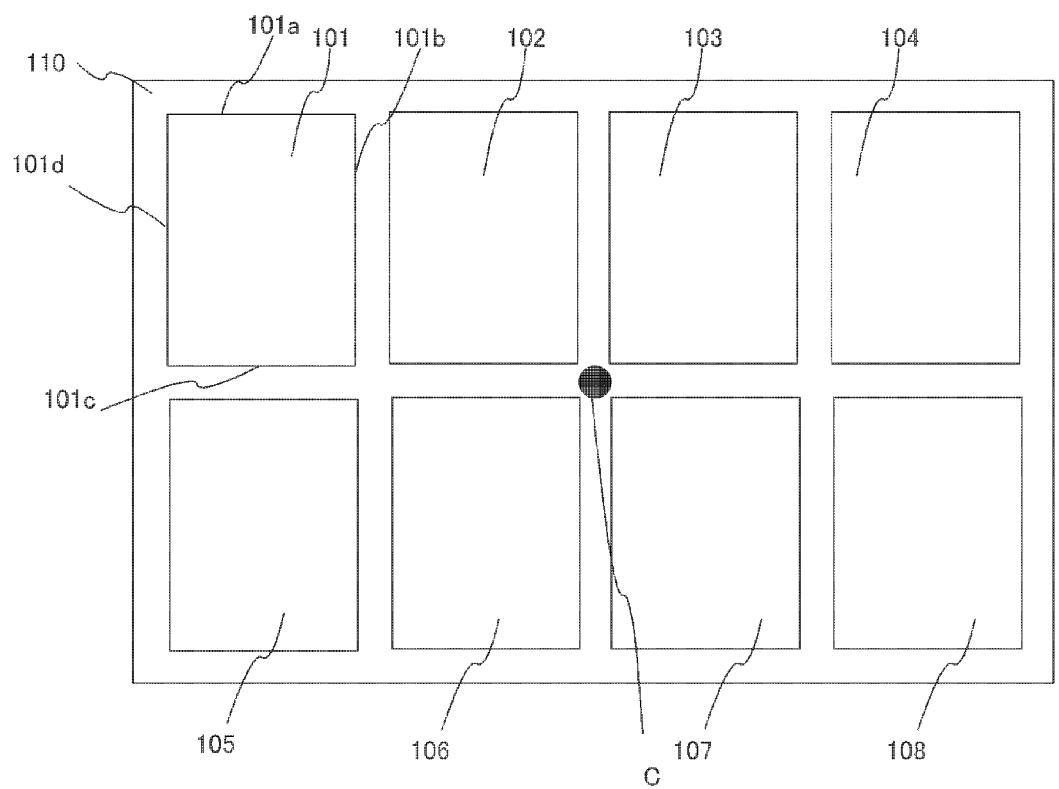

When multiple (e.g., 8) organic EL display panels 101-108 are to be manufactured from one substrate 101 as illustrated in FIG. 8B, drying center point C may appear outside any of the panels. In organic EL display panel 101 for example, the angle difference is determined in such a way that it becomes maximum in the sub-pixels arranged at edges 101a and 101d of organic EL display panel 101 and gradually decreases with approaching drying center point C. Even in this case the angle differences in the sub-pixels at edges 101a and 101d are larger than those in the sub-pixels at the center of substrate 101, which produce the same color as the sub-pixels positioned at edges 101a and 101d.

(Embodiment 2)

Embodiment 1 has been described in which a bank defines coating regions in a matrix pattern. Embodiment 2 is directed to an embodiment in which a bank defines linear coating regions.

Figure 9A:
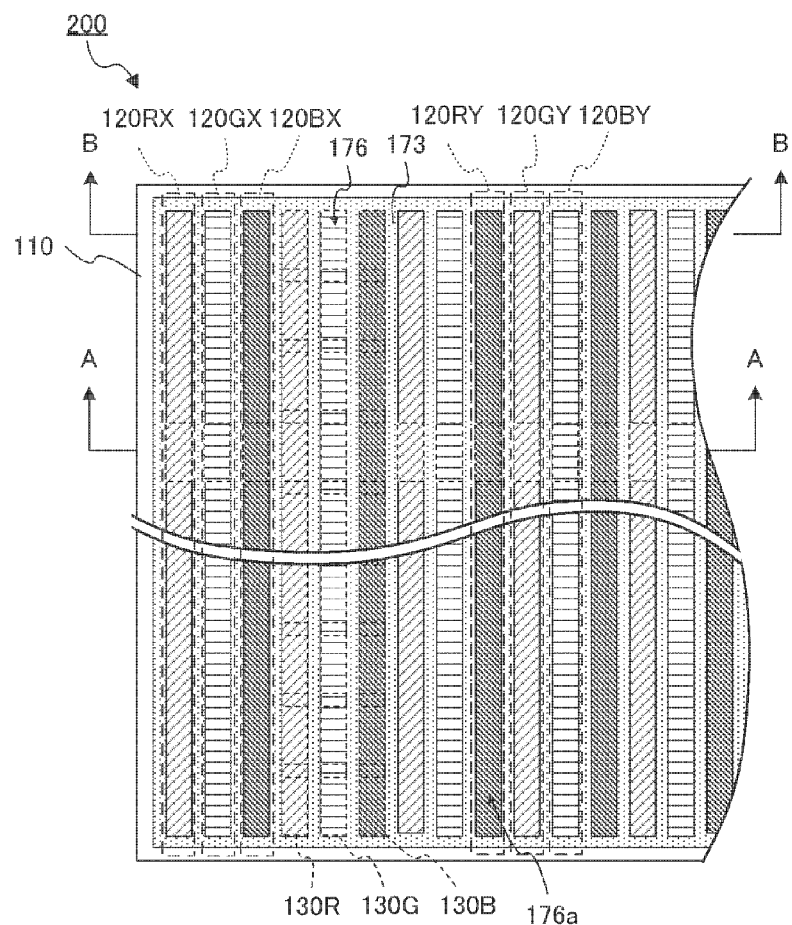
FIGS. 9A and 9B illustrate an organic EL display panel according to Embodiment 2.
Figure 9B:
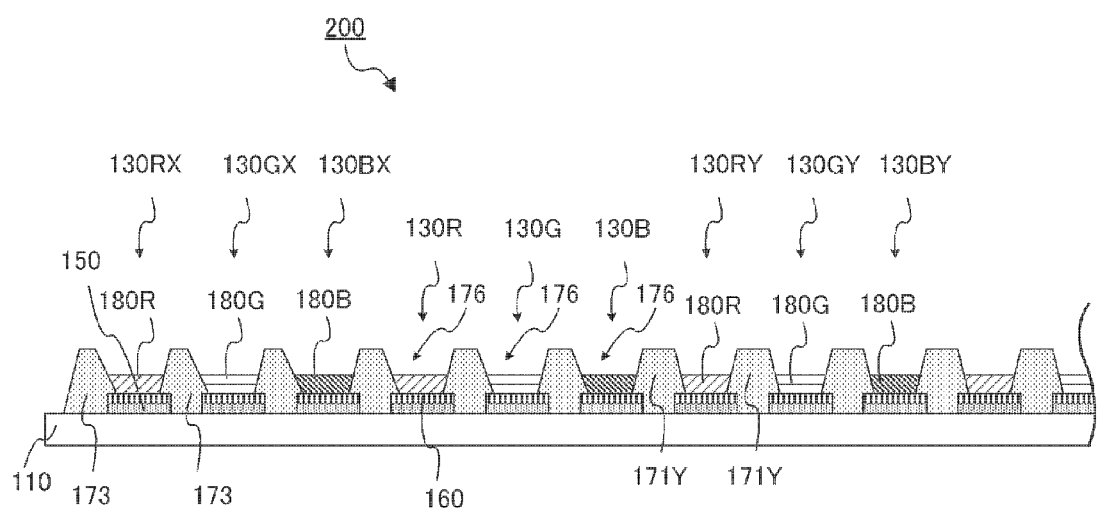

FIG. 9A is a plan view illustrating organic EL display panel 200 according to Embodiment 2. FIG. 9B is a cross-sectional view of organic EL display panel 200 illustrated in FIG. 9A, cut along A-A line. The same components as those of organic EL display panel 100 are given the same reference numerals as those for organic EL display panel 100, and will not be described in this embodiment. As illustrated in FIGS. 9A and 9B, organic EL display panel 200 includes, instead of a lattice-shaped bank, linear banks 173 that run in parallel to one another.

Linear banks 173 define linear coating regions 176 which are shared by sub-pixels 130 arranged in luminescent regions 120. In each linear coating region 176 defined by linear banks 173, linear organic functional layer 180 is formed. Thus, sub-pixels 130 share one linear organic functional layer 180 in each coating region 176.

As in the case of organic El display panel 100, in sub-pixel 130X of organic EL display panel 200, inclination angle α is smaller than inclination angle β as seen from FIG. 9B. Moreover, the difference between inclination angle α and inclination angle β is set larger in sub-pixel 130X than in sub-pixel 130Y. By adjusting the inclination angles of the wall surfaces of coating regions according to the positions of sub-pixels in this manner, it is possible to correct unevenness in the organic functional layers formed in sub-pixels at the edge of the substrate. It is thus possible to correct variations in organic functional layer thickness among pixels.

Figure 10A:
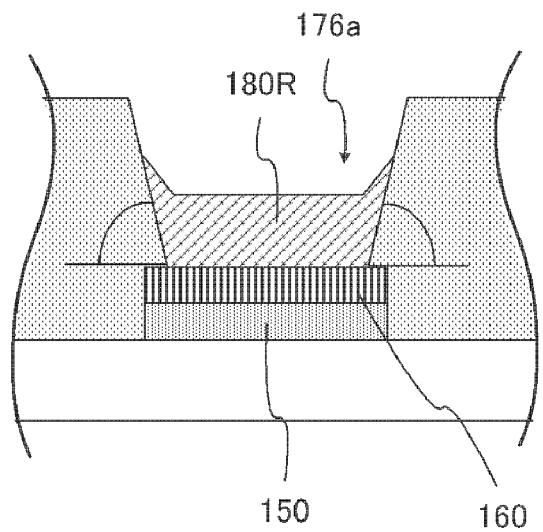
FIGS. 10A and 10B are cross-sectional views illustrating a linear coating region contained in the organic EL display panel according to Embodiment 2.
Figure 10B:
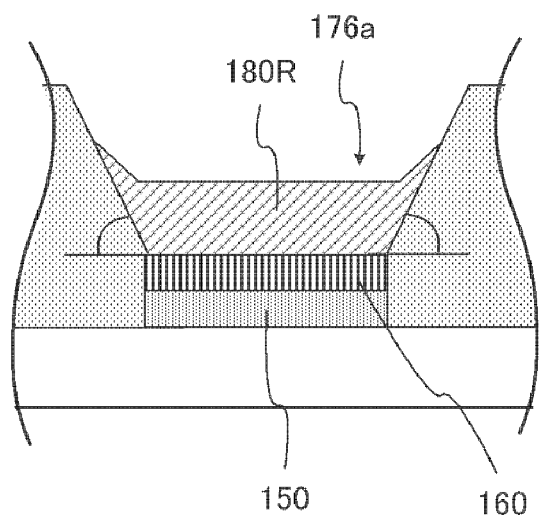

FIG. 10A is a cross-sectional view of linear coating region 176a illustrated in FIG. 9A, cut along A-A line. FIG. 10B is a cross-sectional view of linear coating region 176a illustrated in FIG. 9A, cut along B-B line.

As illustrated in FIGS. 10A and 10B, in this embodiment, the inclination angles of the wall surfaces of coating region 176 change in one linear luminescent region 120. More specifically, in sub-pixel 130X positioned at the middle of the linear luminescent region 120, the inclination angles of the wall surfaces are large (see FIG. 10A), whereas in sub-pixel 130 positioned at an end of linear coating region 176 the inclination angles of the wall surfaces are small (see FIG. 10B).

When coating solutions of organic functional layer are applied in linear coating regions defined by linear banks to form therein linear organic functional layers, it is possible that the applied coating solution is pulled toward both ends of the linear coating region during a drying process, resulting in the formation of an organic functional layer with non-uniform thickness. However, when the inclination angles of the wall surfaces are set smaller at both ends than at the center of the linear coating region as in this embodiment, it is possible to prevent pulling of the coating solution toward both ends of the linear coating region.

Thus, in this embodiment, when coating solutions are applied in linear coating regions to form therein linear organic functional layers, it is possible to correct non-uniformity in the thickness of the organic functional layer and thus to provide organic functional layers each having uniform thickness along their length.

(Embodiment 3)

Embodiment 3 describes an organic EL display panel in which a sectional shape of a pixel electrode differs depending on the positions of sub-pixels.

Figure 11A:
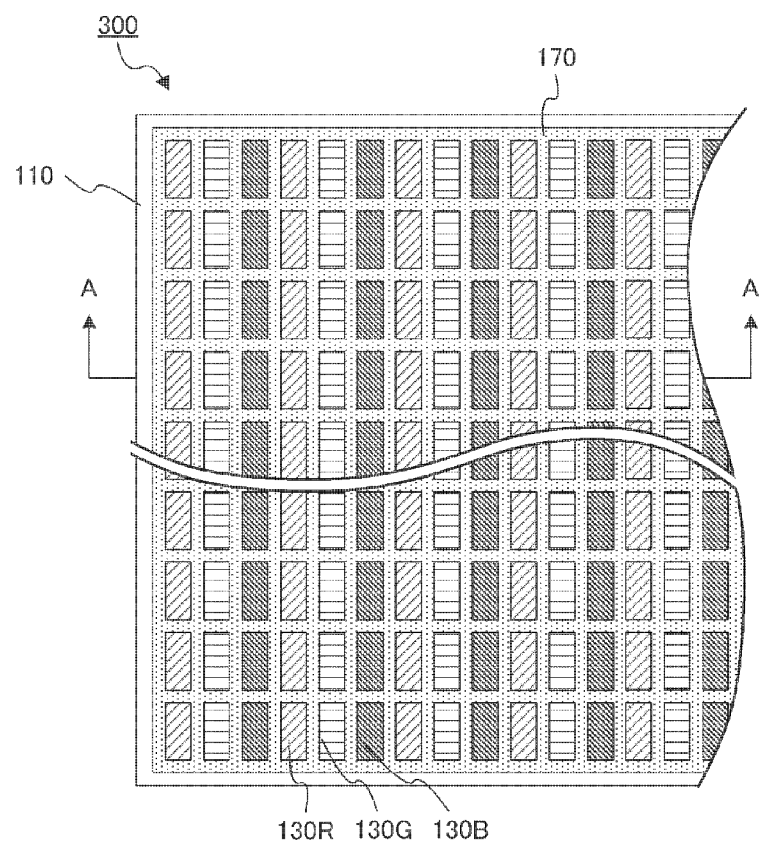
FIGS. 11A and 11B illustrate an organic EL display panel according to Embodiment 3.
Figure 11B:
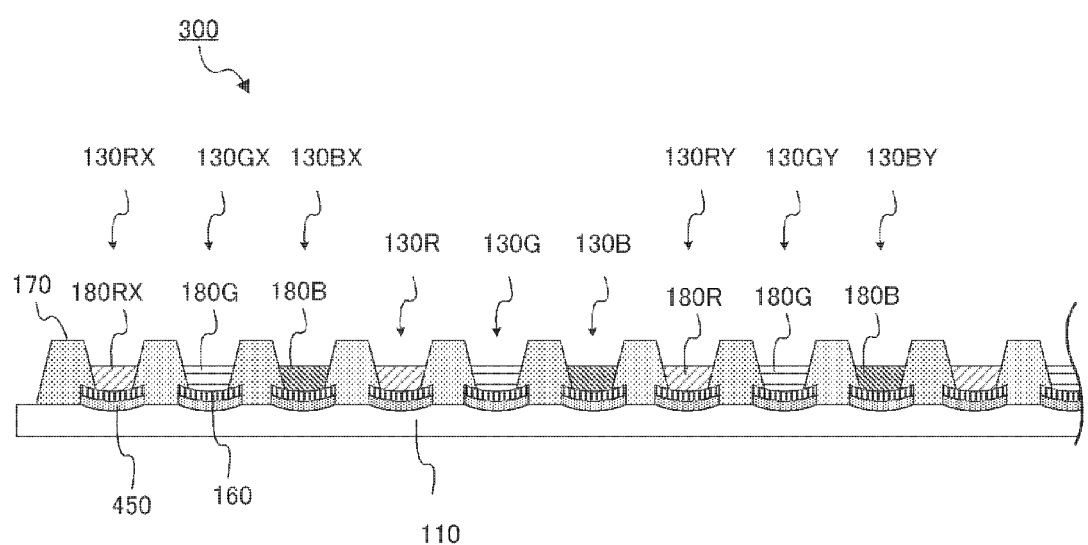

FIG. 11A is a plan view illustrating organic EL display panel 300 according to Embodiment 3. FIG. 11B is a cross-sectional view of organic EL display panel 300 illustrated in FIG. 11A, cut along A-A line.

Organic EL display panel 300 according to Embodiment 3 is identical to organic EL display panel according to Embodiment 1 except that the inclination angles of the wall surfaces of coating regions for sub-pixels which emit the same color of light are the same, and that their pixel electrodes have different sectional shapes. The same components as those of organic EL display panel 100 are given the same reference numerals as those for organic EL display panel 100, and will not be described in this embodiment.

As illustrated in FIG. 11B, in organic EL display panel 300 according to Embodiment 3, sub-pixels 130 include concavely curved pixel electrodes 450. As used herein, "concavely curved pixel electrode" means a pixel electrode whose functional layer side surface is curved and the center of the surface is concaved toward the substrate.

Figure 2A:
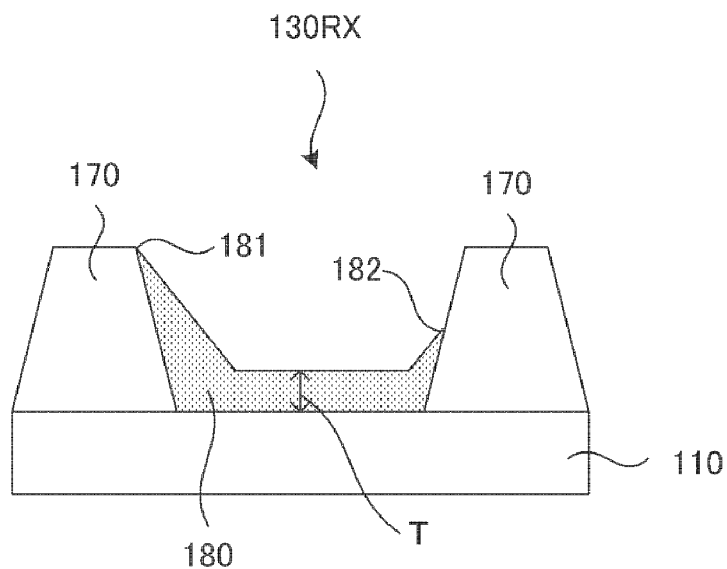
FIGS. 2A and 2B illustrate a functional layer formed by coating.
Figure 2B:
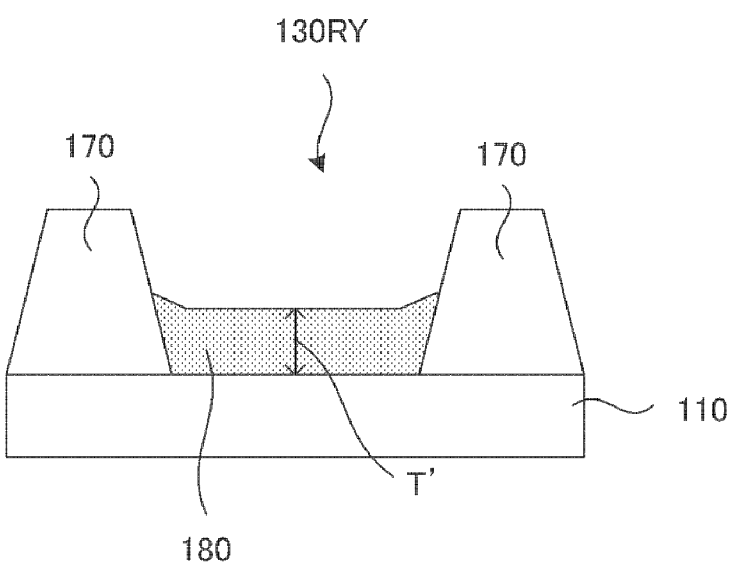

Typically, the top surface of an organic functional layer formed on a pixel electrode, which surfaces faces a counter electrode, is concavely curved (see FIG. 2A). Thus, if the bottom surface of the organic functional layer, which surface faces the substrate, is flat, the resultant organic functional layer has non-uniform thickness. By contrast, when pixel electrode 450 is concavely curved as in this embodiment, the bottom surface of organic functional layer 180 formed on pixel electrode 450 can correspondingly be concavely curved, whereby the top and bottom surfaces of the organic functional layer have the same concavely curved shape and thus the thickness of the organic functional layer in the sub-pixel can be made uniform.

Formation of curved concave pixel electrodes 450 can be achieved by forming curved concave portions on substrate 110 and forming pixel electrodes 450 thereon. Formation of curved concave portions on substrate 110 can be achieved by directly performing wet etching or dry etching, or by photolithography wherein a photosensitive resin film is disposed on a surface of substrate 110 to be curved and concaved, the photosensitive resin film is exposed and developed, and curved and concave portions are formed by patterning.

In this embodiment pixel electrodes have different sectional shapes depending on the positions of sub-pixels. More specifically, sub-pixels 130 include pixel electrodes 450 whose sectional shapes conform to the sectional shapes of their respective organic functional layers 180. For example, in sub-pixel 130X where organic functional layer 180 is thicker on the substrate 110 edge side, pixel electrode 450 has a similar shape conforming to organic functional layer 180. On the other hand, in sub-pixel 130Y where organic functional layer 180 is evenly formed, pixel electrode 450 is likewise evenly formed. The specific shapes of pixel electrode 450 will be described below with reference to the drawings.

Figure 12A:
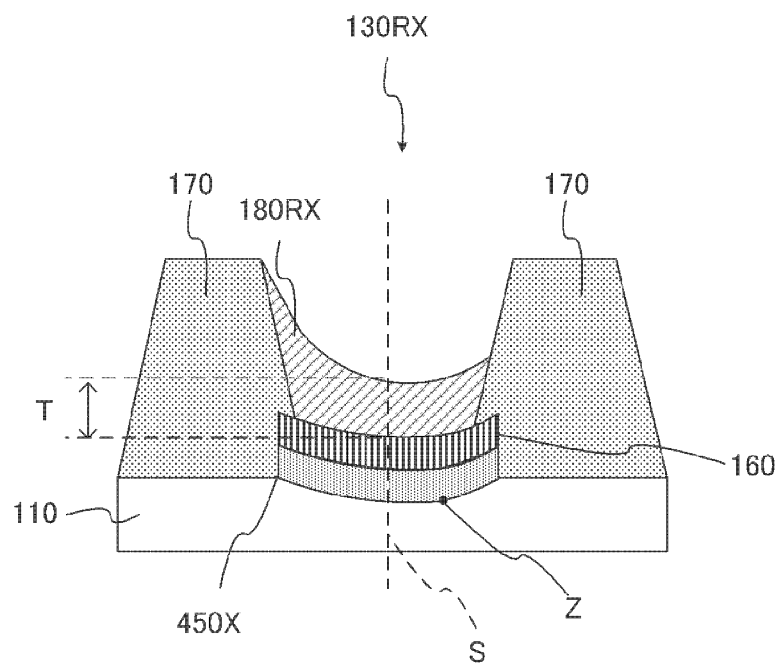
FIGS. 12A and 12B are cross-sectional views illustrating a sub-pixel contained in the organic EL display panel according to Embodiment 3.
Figure 12B:
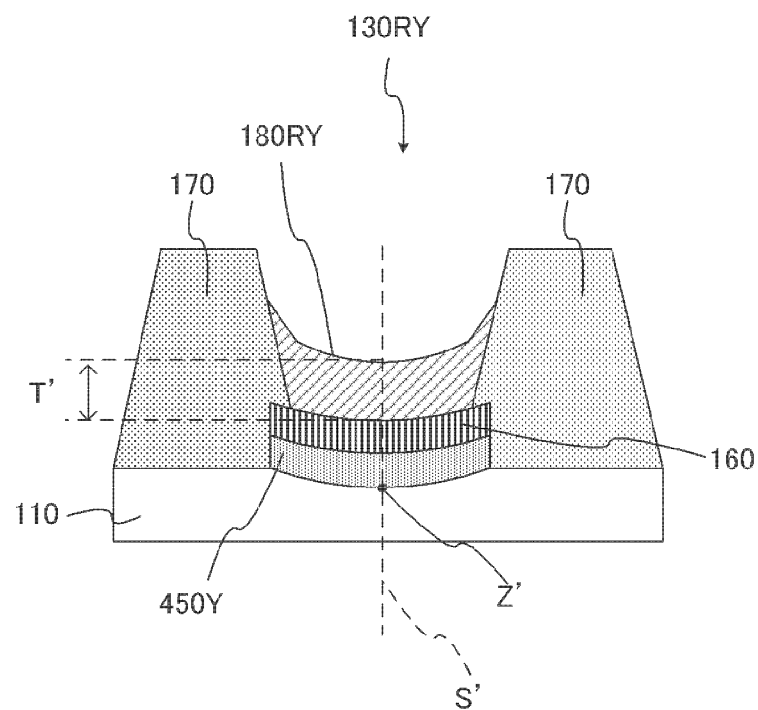

FIG. 12A is an enlarged view of sub-pixel 130RX illustrated in FIG. 11B. FIG. 12B is an enlarged view of sub-pixel 130RY illustrated in FIG. 11B. As illustrated in FIG. 12A, bottom point Z of pixel electrode 450X of sub-pixel 130RX is positioned closer to the center of substrate 110 than is center S of pixel electrode 450. By displacing bottom point of pixel electrode 450 toward the center side of substrate 110 in this way, it is possible to correct the thickness unevenness of functional layer 180RX even when it is thicker on the substrate 110 edge side. As a result, thickness T of organic functional layer 180RX of sub-pixel 130RX equals to thickness T' of organic functional layer 180RY of sub-pixel 130RY.

In pixel electrode 450Y of sub-pixel 130RY, on the other hand, bottom point Z' is at the center of pixel electrode 450Y as illustrated in FIG. 12B. As described above, in this embodiment, bottom point Z of pixel electrode 450X of sub-pixel 130X is positioned closer to the center of substrate 110 than is center S of pixel electrode 450, and the distance between bottom point Z and center S of pixel electrode 450X is larger than the distance between bottom point Z' and center S' of pixel electrode 450Y.

By allowing the sectional shapes of pixel electrodes to conform to the sectional shapes of respective organic functional layers in this way, the organic functional layer in each of the sub-pixels on the substrate edge side can be made uniform in thickness. It is thus possible to correct variations in the thickness of organic functional layers 180, which are formed by coating, among different pixels.

In the same manner that the angle differences decreases with approaching the drying center point in Embodiment 1, it is preferable in this embodiment that, in sub-pixels which emit the same color of light, the distance between the bottom point and center of the pixel electrode decrease with approaching the drying center point.

The disclosure of Japanese Patent Application No.2009-154240, filed on Jun. 29, 2009, including the specification, drawings and abstract, is incorporated herein by reference in its entirety.

INDUSTRIAL APPLICABILITY

The present invention can provide organic EL display panels that offer high brightness.

REFERENCE SIGNS LIST 100, 101, 102, 103, 104, 105, 106, 107, 108, 200, 300: organic EL display panel
110: substrate
120: luminescent region
130: sub-pixel
140: coating solution of organic functional layer
141: liquid droplet edge
150, 450: pixel electrode 160: metal oxide film
170: lattice-shaped bank
171: photosensitive resin film
173: linear bank
175, 176: coating region
180: organic functional layer
181: edge of organic functional layer at substrate edge side
182: edge of organic functional layer at substrate center side
190: half tone mask

The invention claimed is:

1. An organic EL display panel comprising:
   a substrate;
   a plurality of linear luminescent regions formed on the substrate, the luminescent regions running in parallel to one another; and
   two or more sub-pixels arranged in a row in each of the luminescent regions;
   wherein the luminescent regions include a luminescent region having the sub-pixels emitting red light, a luminescent region having the sub-pixels emitting green light, and a luminescent region having the sub-pixels emitting blue light,
   each of the sub-pixels includes a pixel electrode disposed on the substrate, an organic functional layer disposed on the pixel electrode by coating, a counter electrode disposed on the organic functional layer, and a forward tapered bank which constitutes wall surfaces of a region in which the organic functional layer is formed, and
   when an inclination angle of the wall surface of the region on a substrate edge side is defined as inclination angle $\alpha$, and an inclination angle of the wall surface of the region on a substrate center side is defined as inclination angle $\beta$, inclination angle $\alpha$ is smaller than inclination angle $\beta$ in sub-pixel X in luminescent region X provided at the edge of the substrate.

2. The organic EL display panel according to claim 1, wherein a difference between inclination angle $\alpha$ and inclination angle $\beta$ in sub-pixel X is larger than a difference between inclination angle $\alpha$ and inclination angle $\beta$ in sub-pixel Y which emits a same color of light as sub-pixel X and which is arranged in luminescent region Y positioned at the center of the substrate.

3. The organic EL display panel according to claim 1, wherein the region in which the organic functional layer is formed in each of the sub-pixels is entirely surrounded by the bank.

4. The organic EL display panel according to claim 1, wherein the region in which the organic functional layer is formed is shared by the two or more sub-pixels arranged in a row in each of the luminescent region and constitutes one linear region defined by the bank.

5. The organic EL display panel according to claim 4, wherein in one of the linear luminescent regions, the inclination angles of the wall surfaces of the region in which the organic functional layer is formed are larger at the sub-pixel positioned at a middle of the linear luminescent region than at the sub-pixel positioned at an end of the linear luminescent region.

6. The organic EL display panel according to claim 1, wherein the organic functional layer contains an organic EL layer and a hole transport layer.

* * * * *